United States Patent
Yu

(10) Patent No.: US 11,901,030 B2
(45) Date of Patent: *Feb. 13, 2024

(54) METHOD AND MEMORY DEVICE WITH INCREASED READ AND WRITE MARGIN

(71) Applicant: Taiwan Semiconductor Manufacturing Company, Ltd., Hsinchu (TW)

(72) Inventor: Hung-Chang Yu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/848,416

(22) Filed: Jun. 24, 2022

(65) Prior Publication Data
US 2022/0328124 A1    Oct. 13, 2022

Related U.S. Application Data

(63) Continuation of application No. 17/141,176, filed on Jan. 4, 2021, now Pat. No. 11,404,140.

(51) Int. Cl.
| | |
|---|---|
| *G11C 29/50* | (2006.01) |
| *G11C 16/08* | (2006.01) |
| *G11C 29/44* | (2006.01) |
| *G11C 16/28* | (2006.01) |
| *G11C 16/24* | (2006.01) |
| *G11C 16/30* | (2006.01) |

(52) U.S. Cl.
CPC ........ *G11C 29/50004* (2013.01); *G11C 16/08* (2013.01); *G11C 16/24* (2013.01); *G11C 16/28* (2013.01); *G11C 16/30* (2013.01); *G11C 29/44* (2013.01)

(58) Field of Classification Search
CPC ... G11C 29/50004; G11C 29/44; G11C 16/08; G11C 16/24; G11C 16/28; G11C 16/30; G11C 5/147; G11C 7/04; G11C 11/1655; G11C 11/1657; G11C 11/1659; G11C 11/1675; G11C 11/1673; G11C 11/1697; G11C 13/0026; G11C 13/0028; G11C 13/0033; G11C 13/0038; G11C 13/004; G11C 13/0069; G11C 16/10; G11C 16/3418; G11C 29/021; G11C 29/028; G11C 29/4401; G11C 7/12; G11C 8/08
See application file for complete search history.

(56) References Cited

U.S. PATENT DOCUMENTS

2014/0104925 A1*   4/2014   Azuma ............... G11C 13/004
365/148

* cited by examiner

*Primary Examiner* — Sultana Begum
(74) *Attorney, Agent, or Firm* — JCIPRNET

(57) ABSTRACT

A memory device includes a memory array, a reference voltage generator and a driver circuit. The memory array includes a memory cell. The reference voltage generator is configured to generate a reference voltage based on a threshold voltage of a select transistor of the memory cell. The driver circuit is coupled to the reference voltage generator and is configured to generate at least one of a bit line voltage and a word line voltage according to the reference voltage, wherein the memory cell is driven by the at least one of the bit line voltage or the word line voltage, and the reference voltage generator comprises a resistor that is configured to sense the threshold voltage of the select transistor through a current flowing through the resistor.

20 Claims, 8 Drawing Sheets

US 11,901,030 B2

METHOD AND MEMORY DEVICE WITH INCREASED READ AND WRITE MARGIN

CROSS-REFERENCE TO RELATED APPLICATION

This application is a Continuation of U.S. application Ser. No. 17/141,176, filed on Jan. 4, 2021, now allowed. The entirety of the above-mentioned patent application is hereby incorporated by reference herein and made a part of this specification.

BACKGROUND

A memory device that includes a memory array is used in many applications for storing data. In the memory array, a threshold voltage of each memory may vary because of variations during semiconductor manufacturing processes. The variations of the threshold voltages of the memory cells may cause degradation to a read and write margins of read and write operations that are performed to the memory cells. In addition, temperature variations may also degrade the read and write margins of the memory device.

As the demand for high quality memory device has grown recently, a creative technique and design for improving the read margin and write margin of the memory device are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
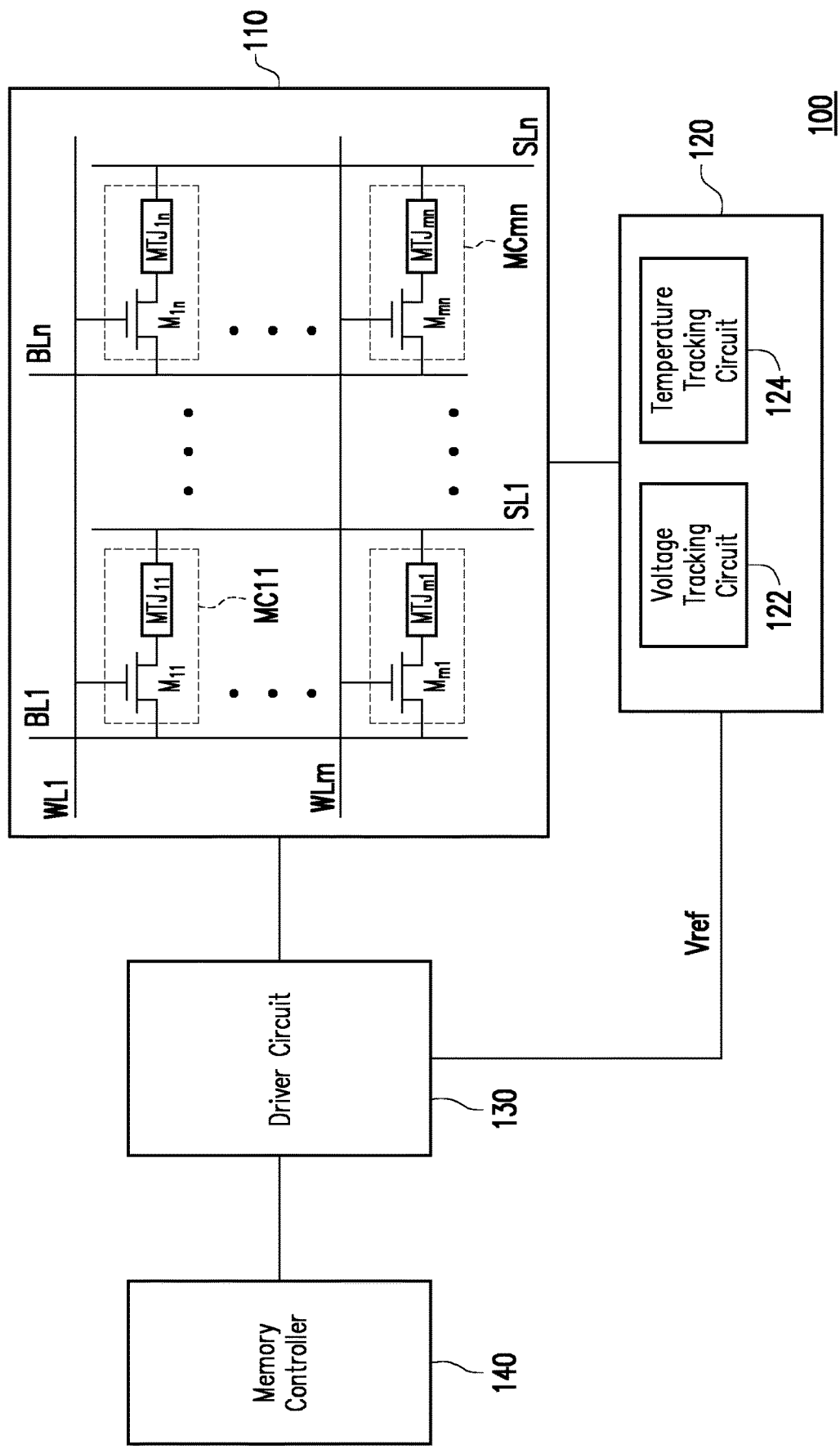
FIG. 1 is a schematic diagram illustrating a memory device in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of a memory device 100 in accordance with some embodiments. The memory device 100 may include a memory array 110, a reference voltage generator 120, a driver circuit 130 and a memory controller 140. The memory array 110 includes a plurality of memory cells MC11 through MCmn that are coupled to a plurality of word lines WL1 through WLm, a plurality of bit lines BL1 through BLn and a plurality of source lines SL1 through SLn, where m and n are positive integers. For example, the memory cell MC11 is coupled to the corresponding word line WL1, the corresponding bit line BL1 and the corresponding source line BL1. Memory operations such as a read operation or a write operation are performed to the memory cells of the memory array 110 through the word line WL1 through WLm, the bit line BL1 through BLn and the source line SL1 through SLn. For example, appropriate word line voltages, bit line voltages and source line voltages are applied to the corresponding word line WL1, the corresponding bit line BL1 and the corresponding source line SL1 to perform the memory operations to the memory cell MC11.

In some embodiments, each of the memory cells MC11 through MCmn includes a select transistor and a storage element, where the select transistor is configured to control an access to the memory cell and the storage element is configured to store data of the memory cell. For example, the memory cell MC11 includes a select transistor M11 and a storage element MJT11 being coupled to the select transistor MC11. In another example, the memory cell MCmn includes a select transistor Mmn and a storage element MJTmn being coupled to the select transistor MCmn. The select transistor in each memory cell is coupled between a corresponding bit line among the bit lines BL1 through BLn and the storage element of the memory cell, and a gate terminal of the select transistor is coupled to a corresponding word line among the word lines WL1 through WLm. For example, the select transistor M11 of the memory cell MC11 is coupled between the bit line BL1 and the storage element MTJ11, and the gate terminal of the select transistor M11 is coupled to the word line WL1. In some embodiments, a threshold voltage of a memory cell is a minimum gate-to-source voltage that is needed to create a conducting path between the source and drain terminals of the select transistor in the memory cell. For example, the threshold voltage of the memory cell MC11 is the minimum gate-source voltage that is needed to create a conducting path between the source and drain terminals of the select transistor M11 of the memory cell MC11.

In some embodiments, each memory cell of the memory array 110 is a magnetoresistive random-access memory (MRAM) cell, and the storage element includes a magnetic tunnel junction (MTJ) element. The MTJ element of each MRAM cell is configured to store data bit based on a resistance value of the MTJ element. The resistance value of the MTJ element may indicates a high resistance state and a low resistance state that correspond to two logic states. It is noted that the memory cells of the memory array are not limited to the MRAM cells. Any memory cell that includes a select transistor and a storage element falls within the scope of the disclosure. For example, in some alternative embodiments, the memory cells MC11 through MCmn of the memory array 110 may be resistive random-access memory (RRAM) cells, phase-change random-access memory (PCRAM) cells or any other suitable types of memory cells.

In some embodiments, the reference voltage generator 120 is coupled to the memory array 110, and is configured to detect and track at least one of a threshold voltage or a temperature from the memory array 110, and to generate a reference signal Vref based on the at least one of the threshold voltage or the temperature. The threshold voltage may be the threshold voltage of at least one memory cell among the memory cells MC11 through MCmn of the memory array 110, and the temperature may be the temperature of the at least one memory cell. In some embodiments, the reference signal Vref is a voltage signal, in which a voltage level of the reference signal Vref is directly proportional to the at least one of the threshold voltage or the temperature. In other words, the voltage level of the reference signal Vref may increase as the at least one of the threshold voltage or the temperature increases; and the voltage level of the reference signal Vref may decrease as the at least one of the threshold voltage or the temperature decreases. In some alternative embodiments, the voltage level of the reference signal Vref is reversely proportional to the at least one of the threshold voltage or the temperature. For example, the voltage level of the reference signal Vref may increase as the at least one of the threshold voltage or the temperature decreases; and the voltage level of the reference signal Vref may decrease as the at least one of the threshold voltage or the temperature increases.

In some embodiments, the reference voltage generator 120 includes a voltage tracking circuit 122 and a temperature tracking circuit 124. The voltage tracking circuit 122 is configured to detect and track a threshold voltage of at least one memory cell among the memory cells MC11 through MCmn of the memory array 110, and to generate a first reference voltage based on the threshold voltage. To detect the threshold voltage of a specific memory cell, the voltage tracking circuit 122 may detect a gate-source voltage of the select transistor in the specific memory cell. For example, the voltage tracking circuit 122 may detect and track the gate-source voltage of the select transistor M11 in the memory cell MC11 to obtain the threshold voltage of the memory cell MC11.

In some embodiments, the voltage tracking circuit 122 may detect and track a threshold voltage of a specific array of memory cells among the memory cells MC11 through MCmn of the memory array 110. In some embodiments, a quantity of the memory cells included in the specific array does not exceed the total quantity of the memory cells in the memory array 110, and is not limited to any specific number in the disclosure. In some embodiments, the gate terminals, source terminal and drain terminals of the memory cells in the specific array of memory cells are respectively coupled to each other during a voltage tracking period of the voltage tracking circuit 122.

In some embodiments, the temperature tracking circuit 124 is configured to track a temperature of a zone of memory cells among the memory cells MC11 through MCmn of the memory array 110. In some alternative embodiments, the temperature tracking circuit 124 is configured to detect a temperature of the entire memory array 110. The temperature tracking circuit 124 may be or may include a temperature sensor or any circuit that has a function of detecting and tracking temperature.

In some embodiments, the driver circuit 130 is coupled to the reference voltage generator 120, and is configured to generate at least one of a bit line voltage or a word line voltage based on the reference signal Vref. The generated bit line voltage is applied to selected bit lines of the memory array 110 when performing the memory operations. The generated word line voltage is applied to the selected word lines when performing the memory operations. In an example, when the memory operation is the read operation, the driver circuit 130 may generate the bit line voltage and apply the bit line voltage to the selected bit lines. In another example, when the memory operation is the write operation, the driver circuit 130 may generate at least one of the bit line voltage or the word line voltage and apply the at least one of the word line voltage or the bit line voltage to at least one of the selected word lines or selected bit lines.

The memory controller 140 includes at least one control logic circuits that are configured to control overall operations of the memory device 100. In some embodiments, the memory controller 140 is coupled to the driver circuit 130 to control an operation of the driver circuit 130. The memory controller 140 may also control a voltage tracking operation and temperature tracking operation of the reference voltage generator 120. In some embodiments, the memory device 100 may further include circuits that are essential for operations of the memory device 100. For example, the memory device 100 may further include a read/write circuit, a row decoder, a column decoder, a sense amplifier, input/output circuits and other circuits (not shown).

Figure 2:
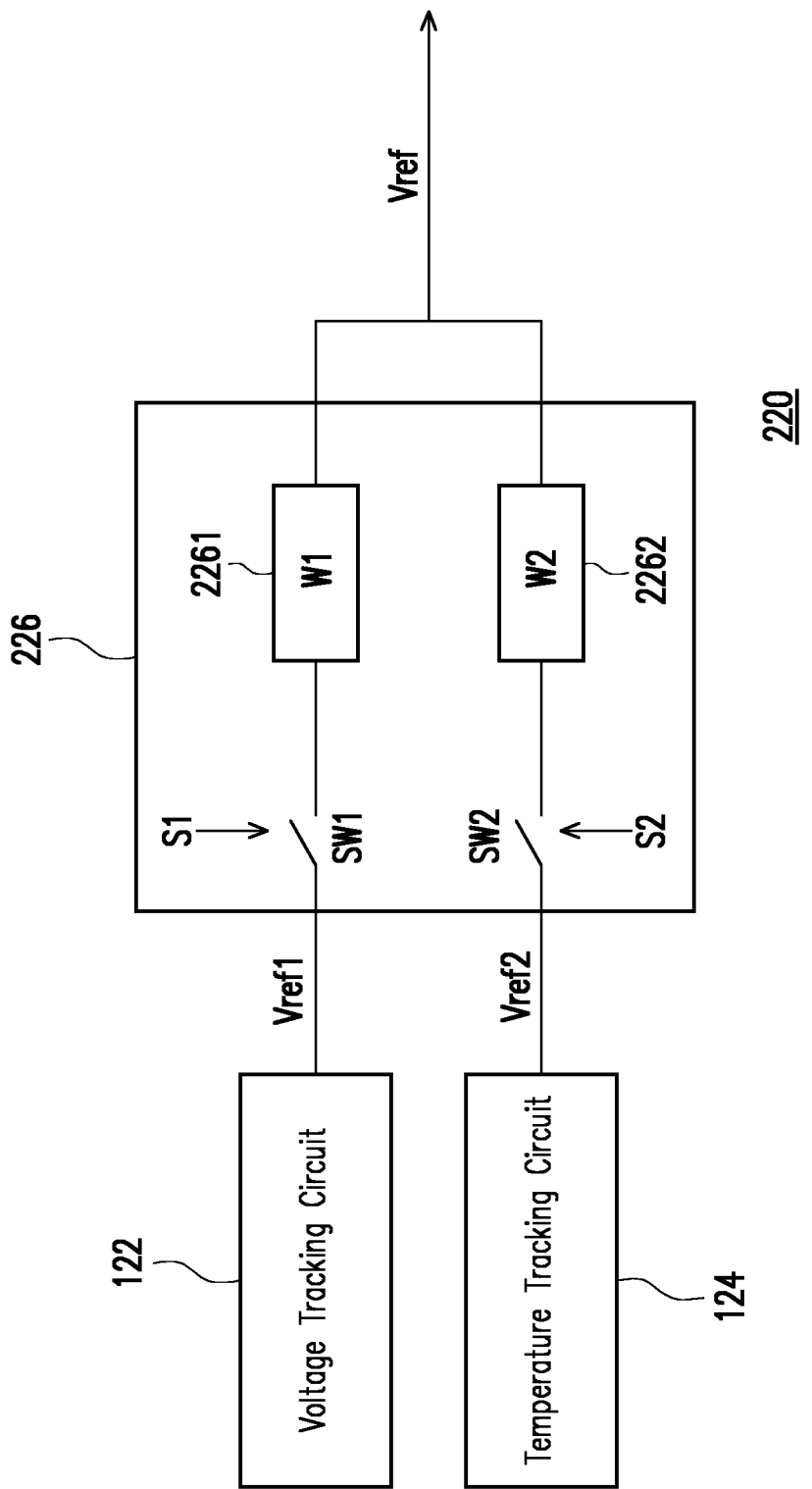
FIG. 2 is a schematic diagram illustrating a reference voltage generator in accordance with some embodiments.

FIG. 2 is a schematic diagram illustrating a tracking circuit 220 in accordance with some embodiments. The reference voltage generator 120 may include the voltage tracking circuit 122, the temperature tracking circuit 124 and a switching circuit 226. The voltage tracking circuit 122 is configured to detect and track a threshold voltage of at least one memory cell to generate a reference signal Vref1. The temperature tracking circuit 124 is configured to detect a temperature of the at least one memory cell to generate a reference signal Vref2. Each of the reference signals Vref1 and Vref2 may be a threshold-voltage-correlated or a temperature-correlated.

The switching circuit 226 is coupled to the voltage tracking circuit 122 and the temperature tracking circuit 124, and is configured to perform switching operations to generate the reference signal Vref based on the reference signals Vref1 and Vref2. In some embodiments, the switching circuit 226 includes switches SW1 and SW2, in which the switch SW1 is coupled to the voltage tracking circuit 122 and the switch SW2 is coupled to the temperature tracking circuit 124. The switches SW1 and SW2 are configured to perform switching operations based on control signals S1 and S2, respectively. In some embodiments, the control signals S1 and S2 are generated by the memory controller (e.g., memory controller 140 in FIG. 1) or other suitable circuit (not shown).

When the switch SW1 is switched on, the reference signal Vref1 that is outputted by the voltage tracking circuit 122 may be included in the reference signal Vref. In this way, the driver circuit (e.g., driver circuit 130 in FIG. 1) may generate the at least one of the bit line voltage or the word line voltage based on the threshold voltage detected by the voltage tracking circuit 122. Similarly, when the switch SW2 is switched on, the reference signal Vref2 that is outputted by the temperature tracking circuit 124 is included in the reference signal Vref. In this way, the driver circuit (e.g., driver circuit 130 in FIG. 1) may generate the at least one of the bit line voltage or the word line voltage based on the temperature detected by the temperature tracking circuit 124. In other words, the switching circuit 226 may selectively select the detected threshold voltage or the detected temperature or a combination of the detected voltage and the detected temperature for adjusting the at least one of the bit line voltage or the word line voltage for the memory operations.

When the reference signal Vref is generated based on both of the reference signals Vref1 and Vref2 (e.g., when both switches SW1 and SW2 are switched on), the switching circuit 226 may set weight values W1 and W2 for the reference signals Vref1 and Vref2 using weighting circuits 22161 and 2262, respectively. The weight values W1 and W2 indicate importance levels of the threshold voltage and the temperature, respectively to the generation of the bit line voltage or the word line voltage. For example, when the threshold voltage is more important than the temperature for generating the bit line voltage and the word line voltage, the weight value W1 is set to be higher than the weigh value W2. When the threshold voltage is less important than the temperature for generating the bit line voltage and the word line voltage, the weight value W1 is set to be lower than the weigh value W2. In some embodiments, the reference signal Vref is generated by mathematical derivation based on the reference signals Vref1 and Vref2. For example, the reference signal Vref is generated according to a weight sum of the reference signals Vref1 and Vref2, but the disclosure is not limited thereto. Any technique to derive the reference signal Vref based on the reference signals Vref1 and Vref2 falls within the scope of the disclosure.

In some embodiments, the switching circuit 226 does not include the switches SW1 and SW2, and the switching operations of the switching circuit 226 are performed by the weighting circuits 2261 and 2262. For example, the weight values W1 and W2 that are set by the weighting circuits 2261 and 2262 may be in a range from 0 to 100, in which the weight value of 100 allows 100% of the reference signal (e.g., Vref1 or Vref2) passing through the weighting circuits, the weight value of 0 does not allow the reference signal (e.g., Vref1 or Vref2) passing through the weighting circuits. In this way, to allow only the reference signal Vref1 passing through the switching circuit 226, the weighting circuit 2261 is configured to set the weight value of 100 for the reference signal Vref1 and the weighting circuit 2262 is configured to set the weight value of 0 for the reference signal Vref2. To allow only the reference signal Vref2 passing through the switching circuit 226, the weighting circuit 2261 is configured to set the weight value of 0 for the reference signal Vref1 and the weighting circuit 2262 is configured to set the weight value of 100 for the reference signal Vref2.

Figure 3B:
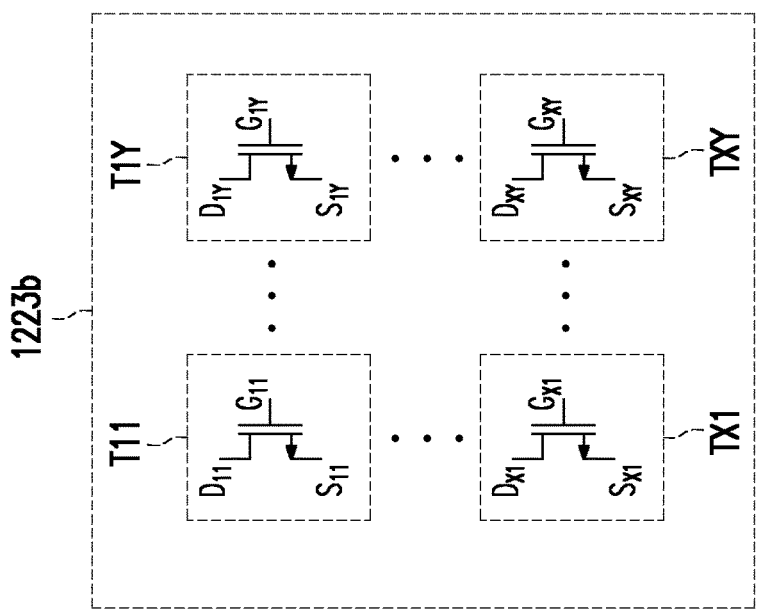
FIGS. 3A through 3B are schematic diagram illustrating a structure of a voltage tracking circuit in accordance with some embodiments.
Figure 3A:
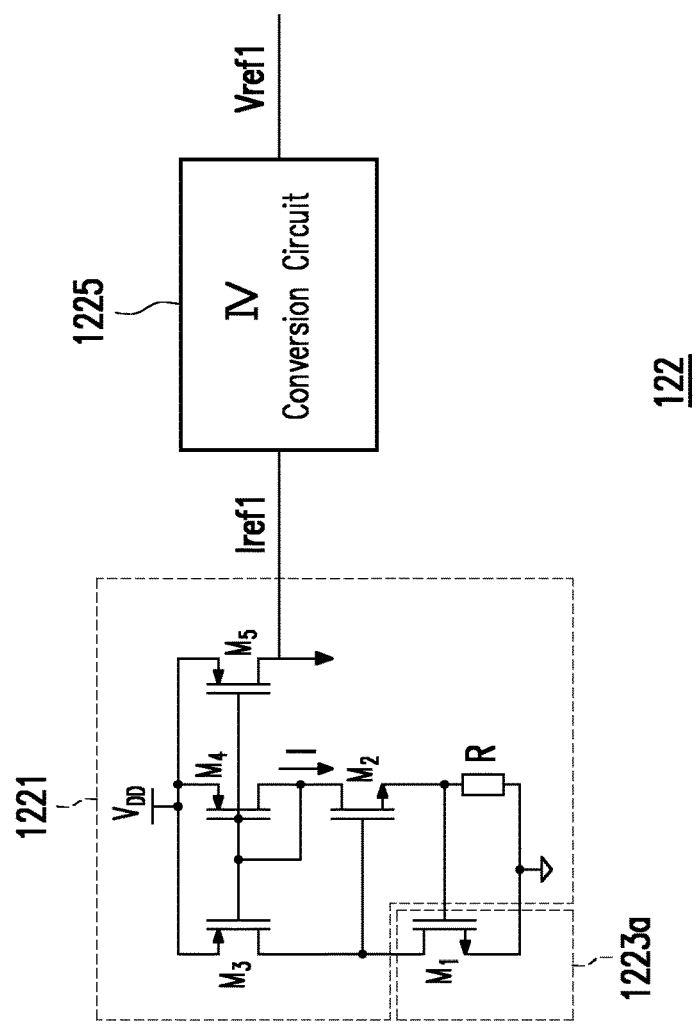

FIG. 3A is a schematic diagram illustrating a structure of the voltage tracking circuit 122 in FIG. 1 in accordance with some embodiments. The voltage tracking circuit 122 is configured to detect and track a threshold voltage of at least one memory cell of the memory array (e.g., memory array 110 in FIG. 1) to generate the reference signal Vref1. The threshold voltage of at least one memory cell may refer to the gate-source voltage of the select transistors included in the at least one memory cell. The select transistors of at least one memory cell in FIG. 1 may be represented as a transistor circuit 1223a in FIG. 3A.

The voltage tracking circuit 122 may include a voltage-to-current (VI) conversion circuit 1221 and a current-to-voltage (IV) conversion circuit 1225. The VI conversion circuit 1221 is coupled to the transistor circuit 1223a and is configured detect and track the threshold voltage of the transistor circuit 1223a to generate a reference current Iref1. In some embodiments, the transistor circuit 1223a may include a transistor M1 that is any one of the select transistors M11 through Mmn of the memory array 110 in FIG. 1. In some alternative embodiments, the transistor circuit 1223a may include an array of transistors, in which the gate terminals of the array of transistors are coupled to each other to form a gate terminal of the transistor circuit 1223a; the drain terminals of the array of the transistor are coupled to each other to form a drain terminal of the transistor circuit 1223a; and the source terminals of the array of transistors are coupled to each other to form a source terminal of the transistor circuit 1223a. The threshold voltage of the transistor circuit 1223a may be the gate-source voltage which is a voltage potential between the gate terminal and the source terminal the transistor circuit 1223a.

The VI conversion circuit 1221 may include a resistor R and a plurality of transistors M2 through M5. The resistor R has two terminals being coupled to the gate terminal and the source terminal of the transistor circuit 1223a, respectively. In other words, the resistor R is coupled in parallel to the gate terminal and the source terminal of the transistor circuit 1223a. As such, the voltage drop on the resistor R is same as the gate-source voltage of the transistor circuit 1223a. As a result of the voltage drop on the resistor R, a current I flows through the resistor R. The value of the current I is determined according to a ratio of the gate-source voltage of the transistor circuit 1123a and the resistance value of the resistor R. In some embodiments, the transistors M2 through M5 forms a current mirror circuit that is configured to mirror the current I to output a reference current Iref1. The reference current Iref1 may be a threshold-voltage-dependent reference current that can be substantially equal to I or a predetermined multiple of I. In other words, a ratio of the reference current Iref1 and the current I may be defined according to a designed needs. For example, the ratio of the currents Iref1 and I may be 1:1 in an embodiment, and may be 2:1 or 0.5:1 or any other ratios in other embodiments. In this way, the VI conversion circuit 1221 may generate the reference current Iref1 that may represent the threshold voltage of the transistor circuit 1223a.

The (IV) conversion circuit 1225 is coupled to the VI conversion circuit 1221 and is configured to convert the reference current Iref1 to generate the reference voltage Vref1. The reference voltage Vref1 is proportional to the reference current Iref1. In other words, as the reference current Iref1 increases, the reference voltage Vref1 increases; and as the reference current Iref1 decreases, the reference voltage Vref1 decreases. It is noted that the disclosure is not limited to any particular circuit structure of the IV conversion circuit 1225. Any circuit that is capable of converting the reference current Iref1 to generate the reference voltage Vref1 falls within the scope of the disclosure. For example, the IV conversion circuit 1225 may include at least one resistor which is coupled between input and output terminals of the IV conversion circuit 1225. When the reference current Iref1 is inputted to the IV conversion circuit 1225, the reference voltage Vref1 is generated based on resistance value of the at least one resistor and is outputted to the output terminal of the IV conversion circuit 1225. As such, the voltage tracking circuit 122 may output the reference voltage Vref1 that may reflect the gate-source voltage (or the threshold voltage) of the transistor circuit 1223*a*.

Referring to FIG. 3A and FIG. 3B, in some embodiments, the transistor circuit 1223*a* in FIG. 3A may include an array of transistors 1223*b*. The array of transistors 1223*b* may include a plurality of transistors T11 through TXY that are selected among the select transistors M11 through Mmn of the memory array 110, where X and Y are positive integers. In some embodiments, the gate terminals G11, G1Y, GX1 and GXY of the transistors T11 through TXY are coupled to each other; the drain terminals D11, D1Y, DX1 and DXY of the transistors T11 through TXY are coupled to each other; and the source terminals S11, S1Y, SX1 and SXY of the transistors T11 through TXY are coupled to each other during a period of measuring the threshold voltages of the select transistors in the memory array (e.g., memory array 110 in FIG. 1). In some embodiments, the gate terminals G11, G1Y, GX1 and GXY of the transistors T11 through TXY are coupled to each other through gate switches (not shown); the drain terminals D11, D1Y, DX1 and DXY of the transistors T11 through TXY are coupled to each other through drain switches (not shown); and the source terminals S11, S1Y, SX1 and SXY of the transistors T11 through TXY are coupled to each other through source switches (not shown). The gate switches, drain switches and source switches may be controlled to measure threshold voltages of the array of transistors 1223*b*. As such, each voltage tracking circuit 122 may detect and track the threshold voltages of a group of memory cells among the memory cells of the memory array 110. Accordingly, the quantity of the voltage tracking circuit 122 (e.g., quantities of the VI conversion circuit 1221 and the IV conversion circuit 1225) in the memory device (e.g., memory device 100 in FIG. 1) is reduced. The manufacturing cost and the size of the memory device is reduced accordingly.

Figure 4:
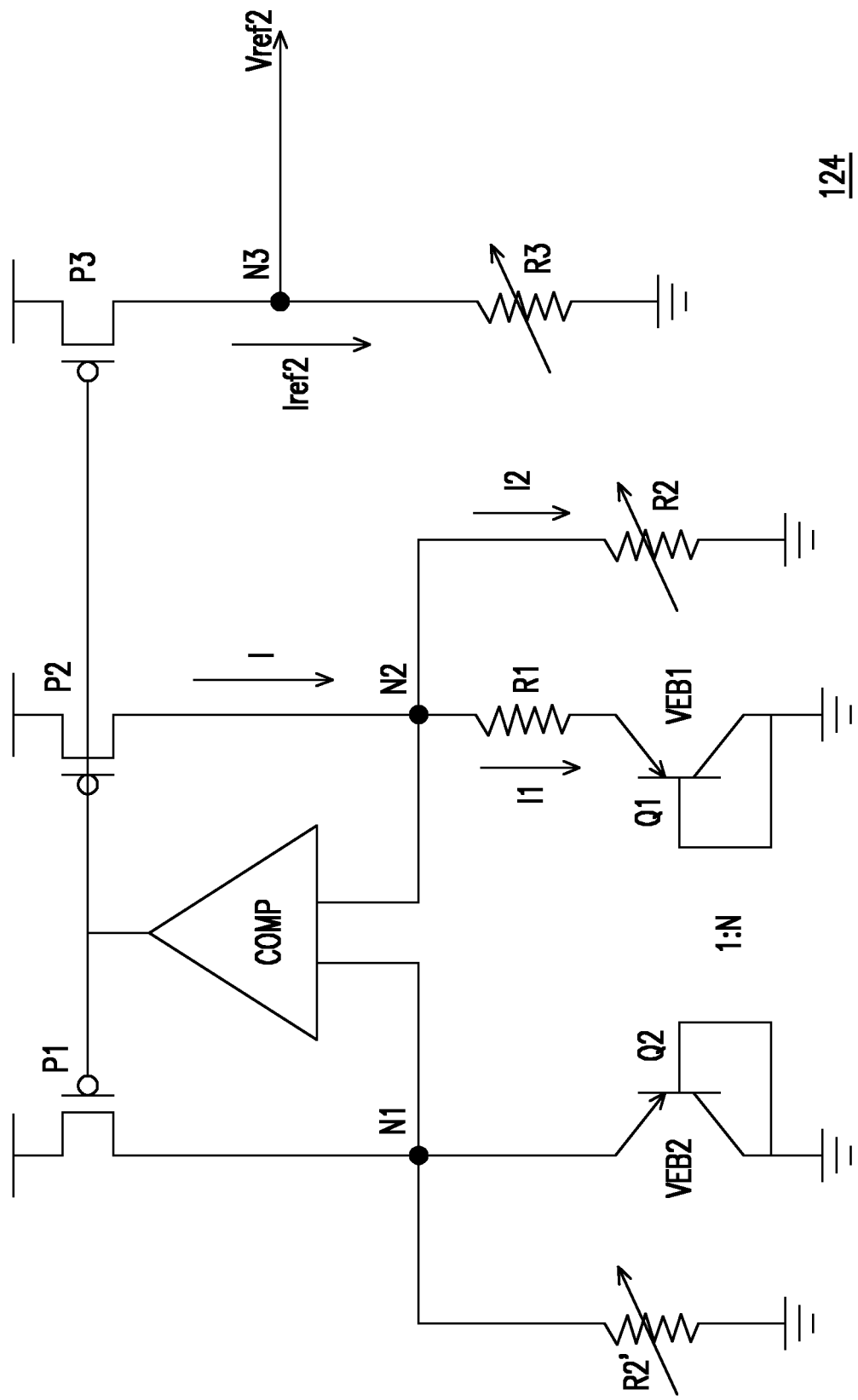
FIG. 4 is a schematic diagram illustrating a temperature tracking circuit in accordance with some embodiments.

FIG. 4 illustrates a schematic diagram of a temperature tracking circuit 124 in accordance with some embodiments. The temperature tracking circuit 124 may detect and track a temperature of a memory cell of the memory array 110, or a group of memory cells among the memory cells of the memory array 110, or the entire memory cells of memory array 110 as show in FIG. 1. In some embodiments, the temperature tracking circuit 124 may include bipolar junction transistors (BJTs) Q1 and Q2 with different current densities. In some embodiments, a ratio of the current densities of the BJT Q1 and the BJT Q2 is 1:N, where N is a positive value. In other words, an emitter current flowing through the emitter terminal of the BJT Q2 is N times higher than the emitter current flowing through the emitter terminal of the BJT Q1. In some embodiments, the current densities of the BJTs Q1 and Q2 are determined according to area emitters of the BJTs Q1 and Q2. In some embodiments, the current densities of the BJTs Q1 and Q2 increases as the emitter areas of the BJTs Q1 and Q2 increase, and vice versa.

The temperature tracking circuit 124 may further includes a resistor R1 and variable resistors R2 and R2', in which the resistor R1 is coupled in series to the BJT Q1, the variable resistor R2' is coupled in parallel to the BJT Q2 through a node N1, and the variable resistor R2 is coupled in parallel to the resistor R1 and the BJT Q1 through the node N2. The temperature tracking circuit 124 may further includes a comparator circuit COMP having input terminals coupled to the nodes N1 and N2. The comparator circuit COMP is configured to set currents in two branches of the temperature tracking circuit 124, such that the voltages at the comparator circuit's inputs (e.g., nodes N1 and N2) are equal to each other. One branch of the temperature tracking circuit 124 includes the BJT Q1 and the node N2, and the other branch of the temperature tracking circuit 124 includes the BJT Q2 and the node N1. As the voltages at the nodes N1 and N2 are equal to each other, the current I1 flowing through the resistor R1 and the current I2 flowing through the variable resistor R2 are determined according to the equations (1) and (2).

$$I1 = \frac{VEB2 - VEB1}{R1} = \frac{VT\text{Log}(N)}{R1} \quad (1)$$

$$I2 = \frac{VEB2}{R2} \quad (2)$$

$$VT = \frac{KT}{q} \quad (3)$$

In equations (1) and (2), VEB2 and VEB1 are the voltage potentials between the emitter terminals and the base terminals of the BJTs Q2 and Q1, respectively. VT is a thermal voltage that is determined according to the equation (3), in which K is the Bolzmann constant, q is the charge of an electron, and T is the absolute temperature in the unit of Kelvin. In some embodiments, the voltages VEB2 and VEB1 are temperature-dependent voltages, in which the levels of the voltages VEB2 and VEB1 vary based on the temperature values. In some embodiments, the current I1 has a positive temperature coefficient (PTC) and the current I2 has a negative temperature coefficient (NTC). In other words, as the temperature increases, the current level of the current I1 increases, and the current level of the current I2 decreases.

In some embodiments, the current I flowing through the node N2 is determined based on the currents I1 and I2 using the equation (4). The current I is mirrored by a mirror circuit that is formed by the transistors P1, P2 and P3 to generate a reference current Iref2 at a node N3. The reference voltage Vref2 is determined according to the reference current Iref2 and the resistance value of a variable resistor R3 using equation (5).

$$I = I1 + I2 = \frac{VEB2}{R2} + \frac{VT\text{Log}(N)}{R1} = \frac{1}{R2}\left[VEB2 + \frac{R2}{R1}VT\text{Log}(N)\right] \quad (4)$$

$$VREF = IREF * R3 = \frac{R3}{R2}\left[VEB2 + \frac{R2}{R1}VT\text{Log}(N)\right] \quad (5)$$

In this way, the reference voltage Vref2 may indicate a temperature of the memory cells in the memory array (e.g., memory array 110 in FIG. 1). In some embodiments, the reference voltage Vref2 may be a PTC, NTC or a zero-temperature coefficient based on the values of R1, R2 and R3.

Figure 5:
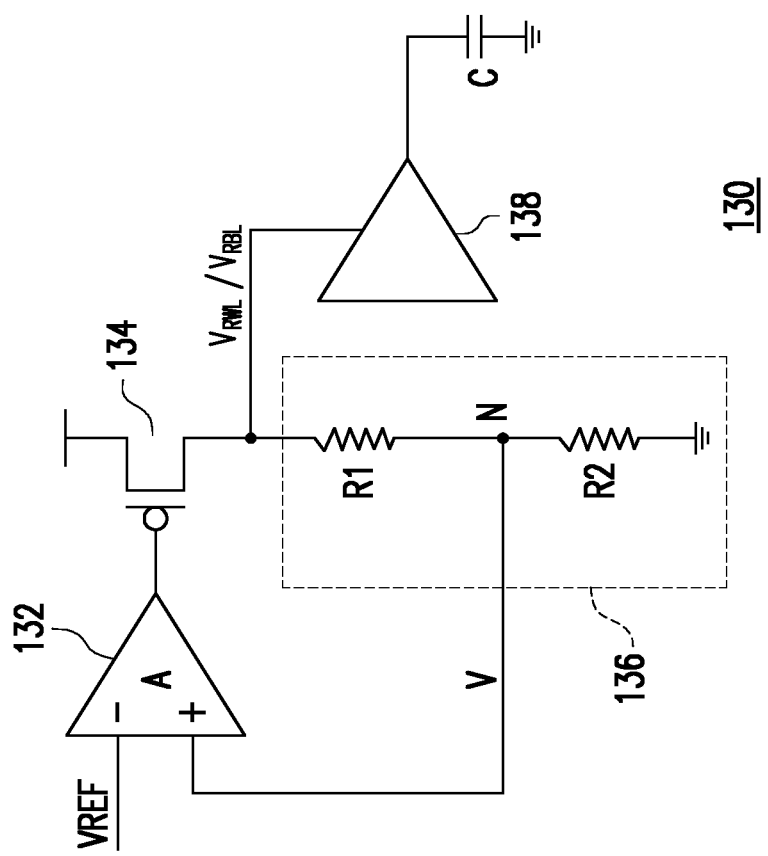
FIG. 5 is schematic diagrams illustrating a driver circuit in accordance with some embodiments.

FIG. 5 is a schematic diagram illustrating a driver circuit 130 in accordance with some embodiments. The reference voltage Vref that is inputted to the driver circuit 130 is generated based on at least one of the reference signals Vref1 or Vref2, in which the reference signal Vref1 indicates a threshold voltage of the at least one memory cell and the reference signal Vref2 indicates a temperature of the at least one memory cell. In other words, the driver circuit 130 may generate at least one of the word line voltage or the bit line voltage for the at least one memory cell based on at least one of the threshold voltage of the at least one memory cell or the temperature of the at least one memory cell.

In some embodiments, the driver circuit 130 includes an operational amplifier 132, a transistor 134, a voltage divider circuit 136 and a word line driver 138. The operational amplifier 132 may receive the reference signal Vref and a feedback voltage V from an output of the transistor 134 through the voltage divider circuit 136. The operational amplifier 132 is configured to generate an error signal that represents a difference between the reference signal Vref and the feedback voltage V. The generated error signal is provided to a control terminal of the transistor 134 to control operations of the transistor 134. In some embodiments, the transistor 134 is configured to generate the at least on of the word line voltage $V_{RWL}$ or the bit line voltage $V_{RBL}$ based on the error signal outputted by the operational amplifier 132.

In some embodiments, the transistor 134 is a low dropout (LDO) transistor that may operate with a low dropout voltage between an input and output of the transistor 134. In this way, the driver circuit 130 may work stably even when the dropout voltage between the input and output of the transistor 134 is low. Further, as the dropout voltage of the transistor 134 is low, less heat is generated and less power is consumed.

In some embodiments, the voltage divider circuit 136 includes resistors R1 and R2 that are coupled in series through a node N. A terminal of the resistor R1 is coupled to the output of the transistor 134 and another terminal of the resistor R1 is coupled to the node N. A terminal of the resistor R2 is coupled to the node N and another terminal of the resistor R2 is coupled to a reference node (e.g., ground GND). The feedback voltage V is generated from the node N, where a voltage level of the feedback voltage V is determined based on the resistance values of the resistors R, R and the voltage level of the word line voltage $V_{RWL}$ or the bit line voltage $V_{RBL}$. The resistance values of the resistors R1 and R2 are determined according to designed needs, and are not limited in the disclosure.

The word line driver 138 is coupled to the output of the transistor 134 to receive the word line voltage $V_{RWL}$ or the bit line voltage $V_{RBL}$, and is configured to drive at least one memory cells of a memory array (e.g., memory array 110 in FIG. 1) using the word line voltage $V_{RWL}$ or the bit line voltage $V_{RBL}$. In some embodiments, a load capacitor C represents capacity load on the word line or the bit line. A structure of the word line drive 138 is not limited in the disclosure. Any circuit structure that may drive the word lines of a memory device using the at least one of the word line voltage $V_{RWL}$ or the line voltage $V_{RBL}$ falls within the scope of the disclosure.

In some embodiments, the reference signal Vref increases when the reference voltage generator (e.g, reference voltage generator 120 in FIG. 1) determines that at least one of the threshold voltage or the temperature of the memory cells increases. When the error signal of the operational amplifier 132 indicates that the reference signal Vref increases, the transistor 134 is controlled to increase the voltage level of the at least one of the word line voltage $V_{RWL}$ or the bit line voltage $V_{RBL}$. When the error signal of the operational amplifier 132 indicates that the reference signal Vref decreases, the driver circuit 130 may reduce the voltage level of the at least one of the word line voltage $V_{RWL}$ or the bit line voltage $V_{RBL}$. In this way, the driver circuit 130 may generate the at least one of the word line voltage or the bit line voltage $V_{RBL}$ based on at least one of the threshold voltage of memory cells or the temperature of memory cells, thereby improving the read and write margin of the read and write operations performed on the memory cells.

In some embodiments, the driver circuit (e.g., driver circuit 130 in FIG. 1) is configured to generate the bit line voltage $V_{RBL}$ based on the at least one of the temperature or the threshold voltage for the read operation on the memory cells of the memory array (e.g., memory array 110 in FIG. 1). In some embodiments, the driver circuit (e.g., driver circuit 130 in FIG. 1) is configured to generate both the adjusted bit line voltage $V_{RBL}$ and the adjusted word line voltage $V_{RWL}$ based on the at least one of the temperature or the threshold voltage for the write operation on the memory cells of the memory array (e.g., memory array 110 in FIG. 1).

Figure 6:
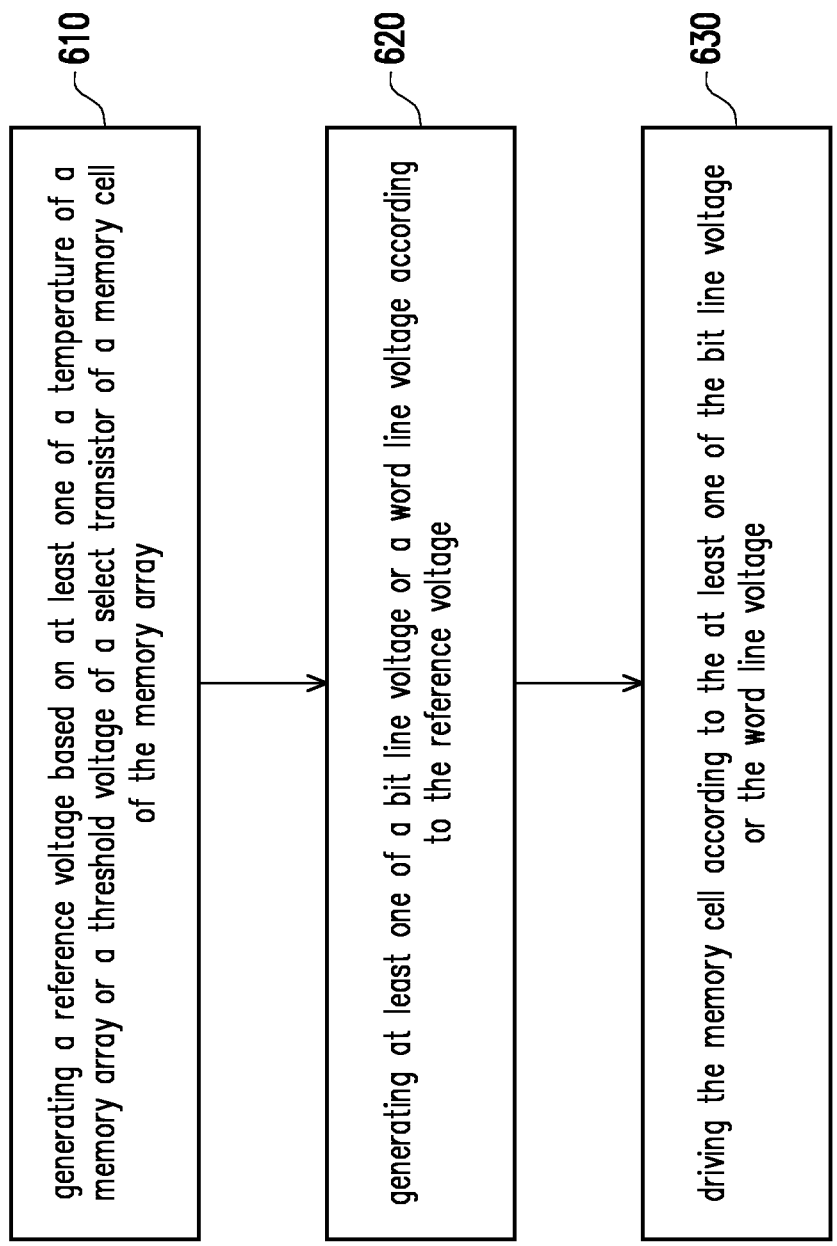
FIGS. 6 through 8 are flowchart diagrams illustrating operative methods of a memory device in accordance with some embodiments.

FIG. 6 is a flowchart diagram illustrating a method of a memory device in accordance with some embodiments. In operation S610, a reference voltage is generated based on at least one of a temperature of a memory array or a threshold voltage of a select transistor of a memory cell of the memory array. In operation S620, at least one of a bit line voltage or a word line voltage is generated according to the reference voltage. In operation S630, a memory cell is driving according to the at least one of the bit line voltage or the adjusted word line voltage.

Figure 7:
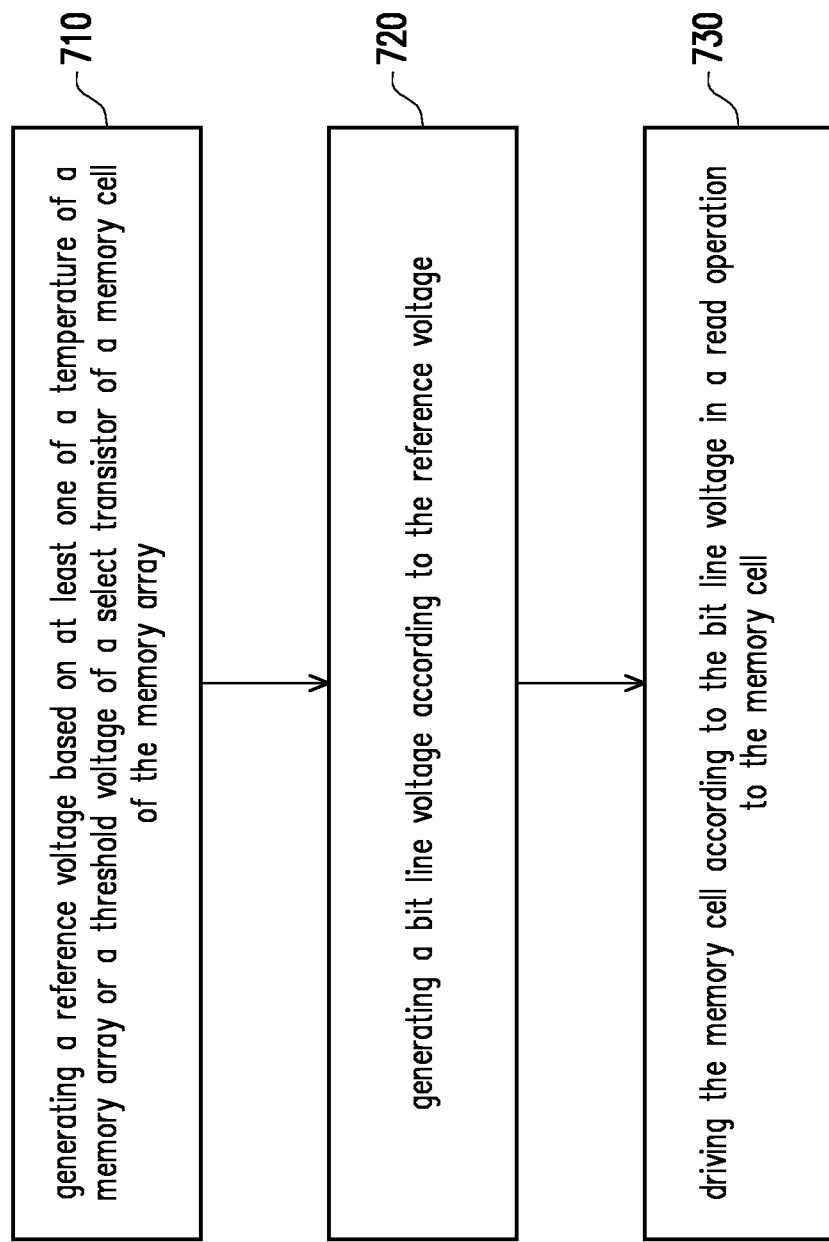

FIG. 7 is a flowchart diagram illustrating a method of a memory device in accordance with some embodiments. In operation S710, a reference voltage is generated based on at least one of a temperature of a memory array or a threshold voltage of a select transistor of a memory cell. In operation S720, a bit line voltage is generated according to the reference voltage. In operation S730, a memory cell is driven according to the bit line voltage in a read operation to the memory cell.

Figure 8:
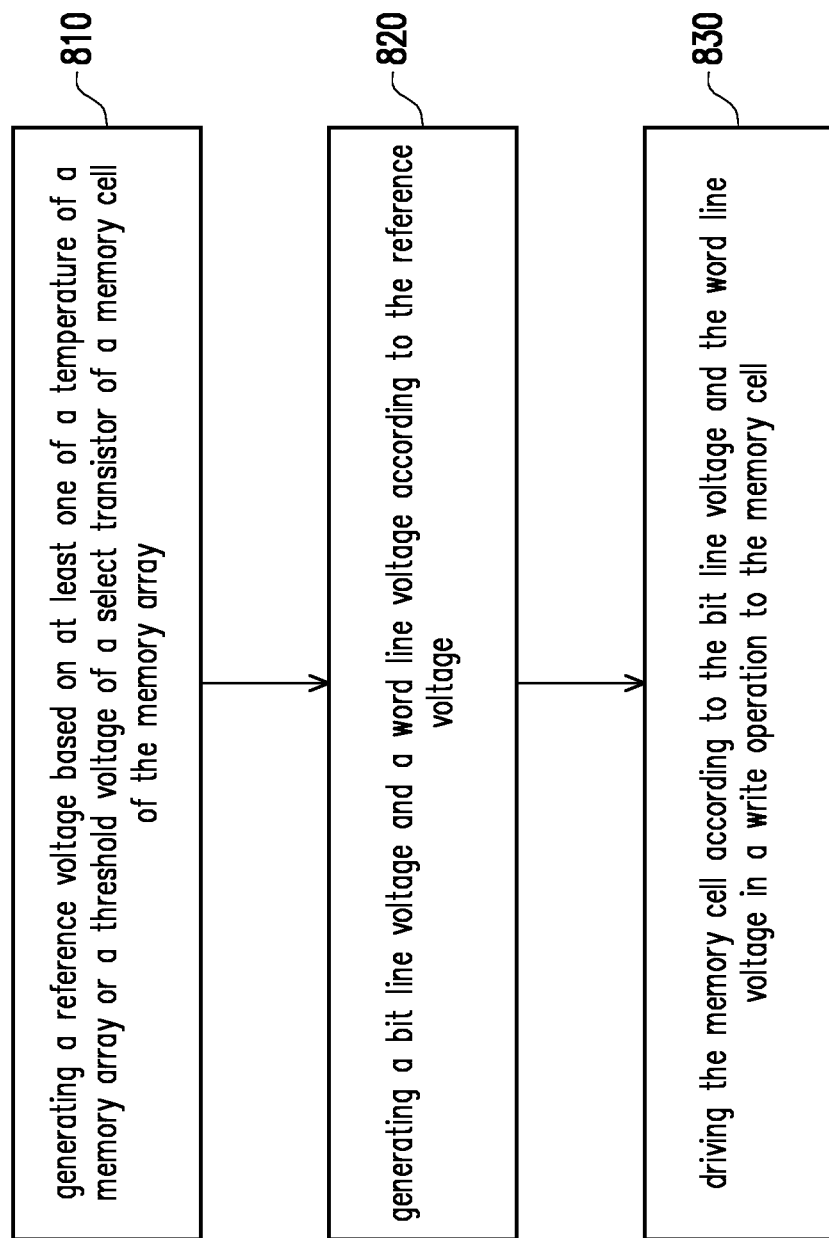

FIG. 8 is a flowchart diagram illustrating a method of a memory device in accordance with some embodiments. In operation S810, a reference voltage is generated based on at least one of a temperature of a memory array or a threshold voltage of a select transistor of a memory cell of the memory array. In operation S820, a bit line voltage and a word line voltage is generated according to the reference voltage. In operation S830, a memory cell is driving according to the bit line voltage and the word line voltage in a write operation to the memory cell.

In accordance with embodiments of the disclosure, at least one of a bit line voltage or a word line voltage is generated according to at least one of a temperature or a threshold voltage of a memory cell. A memory cell is driven according to the at least one of the bit line voltage or the word line voltage in a memory operation such as a read operation or a write operation. In this way, the read margin and the write margin of the read operation and the write operation on the memory cell are increased; and an error rate of the read operation and the write operation on the memory cell is reduced.

In some embodiments, a memory device includes a memory array having a memory cell, a reference voltage generator and a driver circuit. The reference voltage generator is configured to generate a reference voltage based on at least one of a temperature of the memory array or a threshold voltage of a select transistor of the memory cell. The driver circuit is coupled to the reference voltage generator and is configured to generate at least one of a bit line voltage or a word line voltage according to the reference voltage. The memory cell is driving according to the at least one of the bit line voltage or the word line voltage.

In some embodiments, a memory device includes a memory array having a memory cell, a voltage tracking circuit, a temperature tracking circuit and a bit line voltage adjustment circuit. The voltage tracking circuit is configured to generate a first reference voltage based on a threshold voltage of a select transistor of the memory cell. The temperature tracking circuit is configured to generate a second reference voltage based on a temperature of the memory array. The bit line voltage adjustment circuit is coupled to the voltage tracking circuit and the temperature tracking circuit, and is configured to generate a bit line voltage according to at least one of the first reference voltage or the second reference voltage. The memory cell of the memory array is driven according to the generated bit line voltage.

In some embodiments, a method includes operations of generating a reference voltage based on at least one of a temperature of a memory array or a threshold voltage of a select transistor of a memory cell of the memory array; generating at least one of a bit line voltage or a word line voltage according to the reference voltage; and driving the memory cell according to the at least one of the bit line voltage or the word line voltage. The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory device, comprising:
a memory array, comprising a memory cell;
a reference voltage generator, configured to generate a reference voltage based on a threshold voltage of a select transistor of the memory cell; and
a driver circuit, coupled to the reference voltage generator, configured to generate at least one of a bit line voltage or a word line voltage according to the reference voltage, wherein the memory cell is driven by the at least one of the bit line voltage or the word line voltage,
wherein the reference voltage generator comprises:
a resistor, coupled between a gate terminal and a source terminal of the select transistor of the memory cell, configured to sense the threshold voltage of the select transistor through a current flowing through the resistor.

2. The memory device of claim 1, wherein the reference voltage generator further comprises:
a voltage tracking circuit, configured to generate a first reference voltage based on the threshold voltage of the select transistor of the memory cell;
a temperature tracking circuit, configured to track the temperature of the memory array to generate a second reference voltage; and
a switching circuit, coupled to the temperature tracking circuit and the voltage tracking circuit, configured to perform a switching operation to generate the reference voltage based on at least one of the first reference voltage or the second reference voltage.

3. The memory device of claim 2, wherein
the driver circuit is configured to generate the bit line voltage according to at least one of the first reference voltage or the second reference voltage, and
the memory cell is driven by the bit line voltage during a read operation that is configured to read data stored in the memory cell.

4. The memory device of claim 2, wherein
the driver circuit is configured to generate the bit line voltage and the word line voltage according to at least one of the first reference voltage or the second reference voltage, and
the memory cell is driven by the bit line voltage and the word line voltage during a write operation that is configured to write data to the memory cell.

5. The memory device of claim 2, wherein the voltage tracking circuit comprises:
the resistor;
a current mirror circuit, coupled to the resistor, configured to generate a reference current based on the current flowing through the resistor; and
a current to voltage conversion circuit, coupled to the current mirror circuit, configured to convert the reference current to generate the first reference voltage.

6. The memory device of claim 2, wherein
the memory array further comprises a plurality of additional memory cells; and
the resistor is further coupled between gate terminals and source terminals of select transistors of the plurality of additional memory cells.

7. The memory device of claim 2, wherein the reference voltage generator further comprises:
a weighting circuit, coupled to the temperature tracking circuit and the voltage tracking circuit, configured to set a first weight value for the first reference voltage and a second weight value for the second reference voltage, wherein the reference voltage is generated based on the first weight value and the second weight value.

8. The memory device of claim 1, wherein the driver circuit comprises a bit line voltage adjustment circuit that comprises:
a voltage divider circuit, configured to generate a first feedback voltage based on the adjusted bit line voltage;
a differential amplifier, configured to receive the first feedback voltage and the reference voltage, configured to generate a first error signal that is a voltage difference between the first feedback voltage and the reference voltage; and
a transistor, having a control terminal coupled to the differential amplifier, configured to generate the adjusted bit line voltage based on the first error signal.

9. The memory device of claim 1, wherein the driver circuit comprises a word line voltage adjustment circuit that comprises:
a voltage divider circuit, configured to generate a second feedback voltage based on the adjusted word line voltage;
a differential amplifier, configured to receive the second feedback voltage and the reference voltage, configured to generate a second error signal that is a voltage difference between the second feedback voltage and the reference voltage; and
a transistor, having a control terminal coupled to the differential amplifier, configured to generate the adjusted word line voltage based on the second error signal.

10. A memory device, comprising:
a memory array, comprising a memory cell;
a voltage tracking circuit, configured to generate a first reference voltage based on a threshold voltage of a select transistor of the memory cell;
a temperature tracking circuit, configured to generate a second reference voltage based on a temperature of the memory array;
a bit line voltage adjustment circuit, coupled to the voltage tracking circuit and the temperature tracking circuit, configured to generate a bit line voltage according to at least one of the first reference voltage or the second reference voltage, wherein the memory cell is driven by the bit line voltage,
wherein the voltage tracking circuit comprises:
a resistor, coupled between a gate terminal and a source terminal of the select transistor of the memory cell, configured to sense the threshold voltage of the select transistor through a current flowing through the resistor.

11. The memory device of claim 10, wherein the voltage tracking circuit further comprises:
a current mirror circuit, coupled to the resistor, configured to generate a reference current based on the current flowing through the resistor; and
a current to voltage conversion circuit, coupled to the current mirror circuit, configured to convert the reference current to generate the first reference voltage.

12. The memory device of claim 10, wherein
the memory array further comprises a plurality of additional memory cells; and
the resistor is further coupled between gate terminals and source terminals of select transistors of the plurality of additional memory cells.

13. The memory device of claim 10, wherein the bit line voltage adjustment circuit comprises:
a voltage divider circuit, configured to generate a first feedback voltage based on the adjusted bit line voltage;
a differential amplifier, configured to receive the first feedback voltage and the reference voltage, configured to generate a first error signal that is a voltage difference between the first feedback voltage and the reference voltage; and
a transistor, having a control terminal coupled to the differential amplifier, configured to generate the adjusted bit line voltage based on the first error signal.

14. The memory device of claim 10, further comprising:
a word line voltage adjustment circuit, coupled to the voltage tracking circuit and the temperature tracking circuit, configured to adjust a word line voltage according to first reference voltage and the second reference voltage to generate an adjusted word line voltage,
wherein the word line voltage adjustment circuit comprises:
a voltage divider circuit, configured to generate a second feedback voltage based on the adjusted word line voltage;
a differential amplifier, configured to receive the second feedback voltage and the reference voltage, configured to generate a second error signal that is a voltage difference between the second feedback voltage and the reference voltage; and
a transistor, having a control terminal coupled to the differential amplifier, configured to generate the adjusted word line voltage based on the second error signal.

15. A method, comprising:
generating a reference voltage based on a threshold voltage of a select transistor of a memory cell of the memory array;
generating at least one of a bit line voltage or a word line voltage according to the reference voltage; and
driving the memory cell according to the at least one of the bit line voltage or the word line voltage,
wherein generating the reference voltage based on the threshold voltage of the select transistor of the memory cell comprises:
sensing the threshold voltage of the select transistor through a current flowing through a resistor, wherein the resistor is coupled between a gate terminal and a source terminal of the select transistor of the memory cell.

16. The method of claim 15, wherein generating the reference voltage based on the at least one of the temperature of the memory array or the threshold voltage of the select transistor of the memory cell of the memory array further comprises:
generating a first reference voltage based on the threshold voltage of the select transistor of the memory cell;
generating a second reference voltage based on the temperature of the memory array; and
performing a switching operation to generate the reference voltage based on the first reference voltage and the second reference voltage.

17. The method of claim 16, wherein generating the first reference voltage based on the threshold voltage of the select transistor of the memory cell further comprises:
generating a reference current based on the current flowing through the resistor; and
converting the reference current to generate the first reference voltage.

18. The method of claim 16, wherein generating the reference voltage based on the at least one of the temperature of the memory array or the threshold voltage of the select transistor of the memory cell of the memory array further comprises:
setting a first weight value for the first reference voltage and a second weight value for the second reference voltage;
generating a first weighted reference voltage based on the first reference voltage and the first weight value;
generating a second weighted reference voltage based on the second reference voltage and the second weight value; and
generating the reference voltage based on at least one of the first weighted reference voltage or the second weighted reference voltage.

19. The method of claim 15, wherein generating the at least one of the bit line voltage or the word line voltage based on the reference voltage comprises:
generating a first feedback voltage based on the bit line voltage;
generating a first error signal that is a voltage difference between the first feedback voltage and the reference voltage; and
generating the bit line voltage based on the first error signal.

20. The method of claim 15, wherein generating the at least one of the adjusted bit line voltage or the adjusted word line voltage based on the reference voltage to comprises:
generating a second feedback voltage based on the word line voltage;

generating a second error signal that is a voltage difference between the second feedback voltage and the reference voltage; and generating the word line voltage based on the second error signal.

\* \* \* \* \*